United States Patent
Matsudo et al.

(10) Patent No.: US 6,747,748 B2
(45) Date of Patent: Jun. 8, 2004

(54) MANUFACTURING METHOD FOR A FIELD-EFFECT TRANSISTOR, MANUFACTURING METHOD FOR A SEMICONDUCTOR DEVICE, AND APPARATUS THEREFOR

(75) Inventors: Tatsuo Matsudo, Yamanashi (JP); Tomohiro Ohta, Yamanashi (JP); Tetsuji Yasuda, Ibaraki (JP); Masakazu Ichikawa, Tokyo (JP); Takashi Nakayama, Tokyo (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/974,195

(22) Filed: Oct. 10, 2001

(65) Prior Publication Data

US 2002/0115304 A1 Aug. 22, 2002

(30) Foreign Application Priority Data

Oct. 11, 2000 (JP) ........................ 2000-310968

(51) Int. Cl.⁷ .............................. G01B 11/06; G01J 4/00
(52) U.S. Cl. ....................... 356/632; 356/364; 356/369; 356/327; 356/453
(58) Field of Search ................................ 356/364, 369, 356/630, 632, 300, 326, 327, 451, 453

(56) References Cited

U.S. PATENT DOCUMENTS

| | | | |
|---|---|---|---|
| 4,931,132 A | | 6/1990 | Aspnes et al. |
| 5,091,320 A | * | 2/1992 | Aspnes et al. ................. 427/8 |
| 5,170,049 A | * | 12/1992 | De Jonge et al. ........... 250/225 |
| 5,223,080 A | * | 6/1993 | Ohta et al. ..................... 216/2 |
| 5,835,221 A | * | 11/1998 | Lee et al. .................... 356/369 |
| 5,955,139 A | * | 9/1999 | Iturralde ........................ 427/9 |
| 6,449,038 B1 | * | 9/2002 | Stolze ......................... 356/316 |

OTHER PUBLICATIONS

"Solid State Physics" vol. 34, No. 2, pp. 99–109 (1999) (in Japanese).

* cited by examiner

Primary Examiner—Frank G. Font
Assistant Examiner—Roy M. Punnoose
(74) Attorney, Agent, or Firm—Luce, Forward, Hamilton & Scripps

(57) ABSTRACT

In a process of forming a film on a surface of a wafer by thermal processing, laser light generated by a light source is depolarized by a depolarizer and the deporlarized light is irradiated upon the surface of wafer. As for the light reflected from the surface of wafer, polarization components in predetermined two directions perpendicular to each other are extracted by a beam splitter, and optical sensors receive the extracted light components to detect each intensity. An analytical processing unit determines a thickness of a formed film based on a change in a difference in intensity.

10 Claims, 7 Drawing Sheets and gate electrode is formed on the dielectric film. Thus, as for the insulating film formed on the surface of the semiconductor substrate, since the thickness is measured in the unit of atomic layer and the heating is terminated based on the resultant thickness value, the thickness of the insulating film can be precisely controlled in the unit of atomic layer.

MANUFACTURING METHOD FOR A FIELD-EFFECT TRANSISTOR, MANUFACTURING METHOD FOR A SEMICONDUCTOR DEVICE, AND APPARATUS THEREFOR

BACKGROUND OF THE INVENTION

1. Field of the Invention

The present invention relates to a manufacturing method for a field-effect transistor, a manufacturing method for a semiconductor device, and an apparatus therefor.

2. Description of the Related Art

Recently, with the progression of high integration of semiconductor integrated circuits, there has also been required higher miniaturization of semiconductor devices such as a field effect transistor. However, the reliability of the devices must not be deteriorated due to the miniaturization, so both of high miniaturization and high reliability should be realized in such devices.

Particularly, as for a gate insulating film, which is an important structural component of a field effect transistor, such as a MOS transistor, a high dielectric film with a high dielectric constant is being used in place of the conventional silicon oxide film in order to ensure a withstand voltage against the thin thickness of the film. However, when the high dielectric film is directly formed on the silicon substrate, the quality of gate insulating film is decreased to cause an increase in a leak current and a reduction in mobility close to the interface between the silicon substrate and the insulating film. For this reason, as a method for forming the gate insulating film, there has been employed a method in which a thin silicon oxide film is formed on the substrate and the high dielectric film is formed thereon.

If the thickness of silicon oxide film that constitutes two-layered film is too large, the total thickness of the gate insulating film is also large, and this does not meet the requirement of miniaturization. On the other hand, if the thickness of the silicon oxide film is too small, the amount of the leak current increases. For this reason, control of the thickness of silicon oxide film is very important. In recent years, there has been needed an extremely thin oxide film with several angstrom (thickness corresponding to several atomic layers) for miniaturization.

However, the reliability of thin-film measurement by the ellipsometry, which is conventionally used to measure the film thickness, is about over ten angstrom, and the thickness, which is smaller than this value, cannot be accurately measured.

As a method for measuring the thickness of thin film of several atomic layers, RDS (Reflectance Difference Spectroscopy) has been known, and U.S. Pat. No. 4,931,132, which is incorporated herein by reference in its entirety, describes the method of measuring the thickness of crystal growth on the surface of GaAs crystal using this technique. According to this measuring method, in the case of measuring a thickness of a film in which a new atomic layer is formed on the atomic layer already formed as in epitaxial growth, the film thickness is measurable in the atomic layer level since the new atomic layer is formed on a surface to be measured.

However, in general, the gate oxide film is formed by the thermal oxidation and the formation of a film grows toward the inside of the silicon substrate from the surface thereof, and no observable change occurs on the surface. For this reason, it is difficult to carry out such measurement by the same method.

In such a background, the inventors of the present invention made endeavor wholeheartedly this time. Then, we found it possible to observe the state in which the formation of atomic layer grows toward the inside of the silicon substrate by the use of the reflectance difference spectroscopy, and to control the formation of silicon oxide film in order of an atomic layer based on the observed data.

SUMMARY OF THE INVENTION

Accordingly, it is an object of the present invention is to provide a field-effect transistor manufacturing method that is capable of controlling a film formation in order of atomic layer using the aforementioned reflectance difference spectroscopy, a semiconductor device manufacturing method, and its device.

In order to attain the above object, according to a first aspect of the present invention, there is provided a manufacture method for a field-effect transistor comprising steps of heating a semiconductor substrate in a predetermined gas atmosphere to advance a reaction between said gas atmosphere and said semiconductor substrate inwardly from a surface of said semiconductor substrate such that an insulating film formed by said reaction grows from the surface of said semiconductor substrate toward an inside of said semiconductor substrate; irradiating light upon the surface of said semiconductor substrate during said heating step and detecting intensity of polarization components in two directions perpendicular to each other of light reflected from an interface between said semiconductor substrate and said grown insulating film, to obtain a thickness of said insulating film in a unit of atomic layer based on a change in the detected intensity; detecting an end point of said reaction based on the film thickness obtained in said irradiating step to terminate said heating step; forming a dielectric film, having a dielectric constant higher than said insulating film, on said insulating film; and forming a gate electrode on said dielectric film.

In order to attain the above object, according to a second aspect of the present invention, there is provided a manufacturing apparatus for a semiconductor device comprising steps of: advancing a reaction toward an inside of a target to form a film in a surface area of said target; irradiating light upon the surface area of said target; detecting intensity of polarization components in two directions perpendicular to each other of the irradiated light which is reflected from the surface of said target; obtaining a thickness of said film formed in said reaction based on a change in the intensity of polarization components of said reflected light detected; and controlling said reaction based on the film thickness obtained.

In order to attain the above object, according to a second aspect of the present invention, there is provided a manufacturing apparatus for a semiconductor device comprising: a process chamber for thermally processing a target in atmosphere including a predetermined gas; an optical apparatus for irradiating light upon said target provided in said process chamber, measuring intensity of polarization components in two directions perpendicular to each other of light reflected from said target, and outputting a measurement signal; and a controller, which is connected to said process chamber and said optical apparatus, for starting a thermal processing to form a film in said target in said process chamber in atmosphere including said predetermined gas, obtaining a thickness of said film formed during said thermal processing based on the measurement signal from said optical apparatus, and terminating said thermal processing if the thickness of said film reaches a predetermined value.

DETAILED DESCRIPTION OF THE PREFERRED EMBODIMENT

An embodiment of the present invention will be specifically described with reference to the accompanying drawings.

Figure 1:
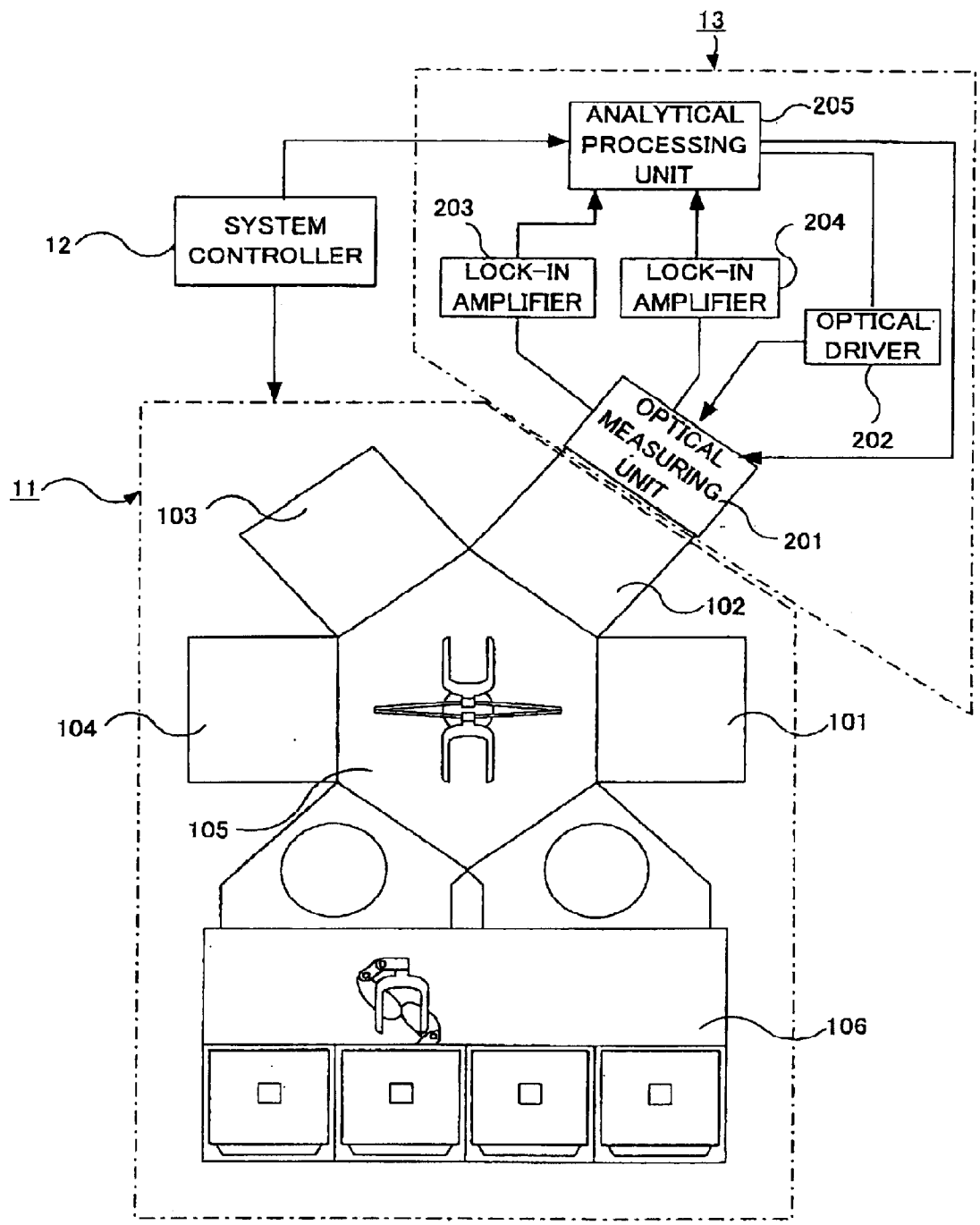
FIG. 1 is a block diagram illustrating the structure of a semiconductor device manufacturing apparatus according to an embodiment of the present invention.

FIG. 1 illustrates a structure of a semiconductor device manufacturing apparatus according to this embodiment, that forms a gate insulating film, i.e., a silicon oxide film ($SiO_2$) on a wafer W. The manufacturing apparatus of this embodiment comprises a process chamber for forming an oxide film, a preliminary cleaning chamber, a process chamber for forming a high dielectric film, and a process chamber that performs annealing.

As illustrated in FIG. 1, the manufacturing apparatus of this embodiment is composed of a processing system 11, a system controller 12, and an optical measuring system 13.

The processing system 11 includes a cleaning chamber 101, a RTO (Rapid Thermal Oxidation) chamber 102, a CVD (Chemical Vapor Deposition) chamber 103, an annealing chamber 104, a load lock chamber 105, and a loader module 106.

The cleaning chamber 101 is provided to remove a natural oxide film on a wafer W before oxidation by hydrofluoric acid (HF) vapor treatment, ultraviolet ray-chlorine treatment, or the like.

The RTO chamber 102 is connected to a gas source which supplies oxygen or oxygen compound such that a gas atmosphere including oxygen be created in the RTO chamber 102. The RTO chamber 102 has a heating lamp having a light source such as a halogen lamp in its interior, and the wafer W fixedly loaded is heated by this heating lamp to oxidize the surface of the silicon (Si) wafer W, whereby forming a silicon oxide ($SiO_2$) film.

The CVD chamber 103 provides CVD processing to the wafer W to form a high dielectric insulating film, for example, $ZrSiO_2$ film on the $SiO_2$ film.

The annealing chamber 104 provides annealing processing to the filmed wafer W to stabilize the film and make the quality thereof higher.

The loader module 106 and load lock chamber 105 are structured to optimize the loading/unloading of wafer W into/from the respective chambers and the manufacturing apparatus.

The load lock chamber 105 functions as a common room for connecting the chambers and the loader module 106, where the atmosphere is kept in an airtight manner and under a reduced atmosphere that is interrupted from air.

The system controller 12 controls the manufacturing apparatus including all processes, that is, the loading of wafer W to the manufacturing apparatus, cleaning in the cleaning chamber 101, oxidizing in the RTO chamber 102, CVD in the CVD chamber 103, cleaning in the annealing chamber 104, unloading of wafer W from the manufacturing apparatus.

The optical measuring system 13 includes an optical measuring unit 201, an optical driver 202, a first lock-in amplifier 203, a second lock-in amplifier 204, and an analytical processing unit 205. The optical measuring system 13 vertically irradiates a light for measurement upon the surface of the wafer W according to RDS (Reflectance Difference Spectroscopy) to be described later. Then, regarding polarization components of the light reflected from the surface in predetermined two ways, the optical measuring system 13 measures the reflectances thereof, and optically evaluates characteristics of the surface of the wafer W, particularly, a thickness of $SiO_2$, film based on the difference between two measured reflectances FIG. 2 illustrates the structure of optical measuring unit 201.

Figure 2:
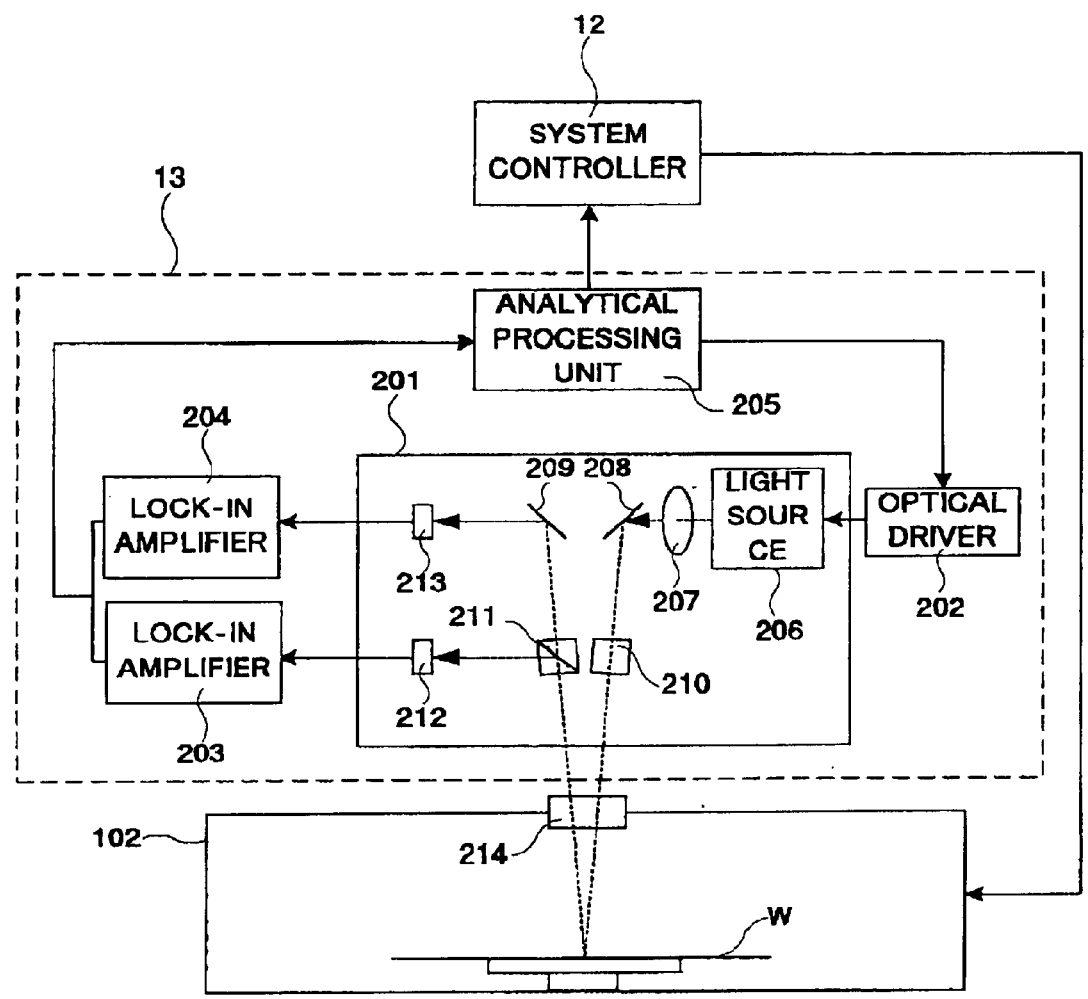
FIG. 2 is a cross-sectional view illustrating the structure of an optical measuring unit according to the embodiment of the present invention.

As illustrated in FIG. 2, the optical measuring unit 201 is provided in the vicinity of a window 214 of RTO chamber 102. Here, the window 214 is, for example, a quartz window. Namely, optical measuring unit 201 is provided to face the wafer W in such a way that the surface of wafer W placed in the RTO chamber 102 can be vertically irradiated with light through the window 214.

The optical measuring unit 201 includes a light source 206, a collimate lens 207, first and second reflecting mirrors 208, 209, a depolarizer 210, a beam splitter 211, and first and second optical sensors 212, 213.

The light source 206 includes, for example, a laser diode that generates light with a single wavelength, e.g., a violet laser diode (wavelength of about 395 mm) The optical driver 202 controls current and temperature in accordance with an instruction from the analytical processing unit 205 to control the light source 206.

The collimate lens 207 is provided on an optical path of laser light generated from the light source 206, and corrects the generated laser light to a parallel light. The light passed through the collimate lens 207 is reflected by the first reflecting mirror 208, and is irradiated vertically (~90±2°) at the center of wafer W placed on the RTO chamber 102 through the window 214 of RTO chamber 102.

The depolarizer 210 is placed on the optical path leading from the first reflecting mirror 208 to the wind 214 and depolarizes the laser light that is originally polarized.

The beam splitter 211 is, for example, a polarizing beam splitter. The beam splitter 211 reflects a polarization component in the predetermined direction of the light substantially vertically reflected from the surface of wafer W to make the polarization component go into the first optical sensor 212, while the beam splitter 211 reflects a polarization component in a direction perpendicular to the predetermined direction to go to the second optical sensor 213, whereby extracting the polarization components in the two ways perpendicular to each other.

The first and second optical sensors 212 and 213 are, for example, optical sensors such as photo diode and the like.

The first optical sensor 212 is provided in such a way that it can receive one polarization component reflected by the beam splitter 211, and it is connected to the first lock-in amplifier 203. The second optical sensor 213 is provided in such a way that it can receive the other polarization component passed through beam splitter 211, and it is connected to the second lock-in amplifier 204.

The first and second lock-in amplifiers 203 and 204 are connected to the optical driver 202, and convert light intensity data received from the optical sensors 212, 213 into signals. The first and second lock-in amplifiers 203 and 204 send signals $S_1$ and $S_2$, indicative of reflectances of the respective polarization components, to the analytical processing unit 205, respectively.

The analytical processing unit 205 calculates a variation ratio $\Delta \bar{r}/\bar{r}$ of a difference in reflectances from the signals sent from the first and second lock-in amplifiers 203 and 204 by expression (1) described below, to evaluate the thickness of a film formed based on the variation ratio of the difference in reflectances. The analytical processing emit 205 sends the obtained data of the film thickness to the system controller 12.

$$\frac{\Delta \bar{r}}{\bar{r}} = \frac{S_1 - S_2}{(S_1 + S_2)/2} \quad (1)$$

The following will explain the flow for measuring a film thickness using the above-structured optical measuring system 13.

Firstly, light generated from the light source 206 passes through the collimate lens 207, is reflected by the first reflecting mirror 208, and is depolarized by the depolarizer 210. Then, the processing surface of the wafer W is vertically irradiated with the resultant light. From light reflected from the wafer W, components in the predetermined two ways (directions) are extracted by the beam splitter 211 respectively. One component reflected by the beam splitter 211 is received by the first optical sensor 212, while the other component reflected by the beam splitter 211, which is reflected by the second reflecting minor 209, is received by the second optical sensor 213.

Intensity data of the polarization components detected by the first and second optical sensors 212 and 213 are sent to the first and second lock-in amplifiers 203 and 204, respectively. The first and second lock-in amplifiers 203 and 204 provides a predetermined processing to the received intensity data, and send signals $S_1$ and $S_2$, indicative of reflectances of the respective polarization components, to the analytical processing unit 205, respectively.

The analytical processing unit 205 calculates the variation ratio of the difference in the reflectances from the signals sent from the first and second lock-in amplifiers 203 and 204 by the aforementioned expression (1) to evaluate the thickness of the oxide film formed on the surface of the wafer W. The analytical processing unit 205 sends the obtained data about film thickness to the system controller 12. The system controller 12 monitors the data of the film thickness received from the analytical processing unit 205 and controls the film forming process.

Principle of Reflectance Difference Spectroscopy

Here, an explanation will be briefly given to the principle of Reflectance Difference Spectroscopy (RDS). Reflectance difference spectroscopy is a method in which a variation in reflectance difference with the polarizing direction is measured as for the complex reflectance of the polarization light vertically irradiated to the specimen surface. Namely, this is a linear optical measuring method that is extremely sensitive to the surface or interfacial structure when an optical response of the bulk part of the sample indicates an isotropic property. The details on RDS are described in "Solid State Physics" Vol. 34, No. 2, pp. 19–29, 1999, which is incorporated herein by reference in its entirety. Also, U.S. Pat. No. 4,931,132, which is incorporated herein by reference in its entirety, describes one that uses the reflectance difference spectroscopy to evaluate the crystal growth on the surface of GaAs crystal.

Figure 3:
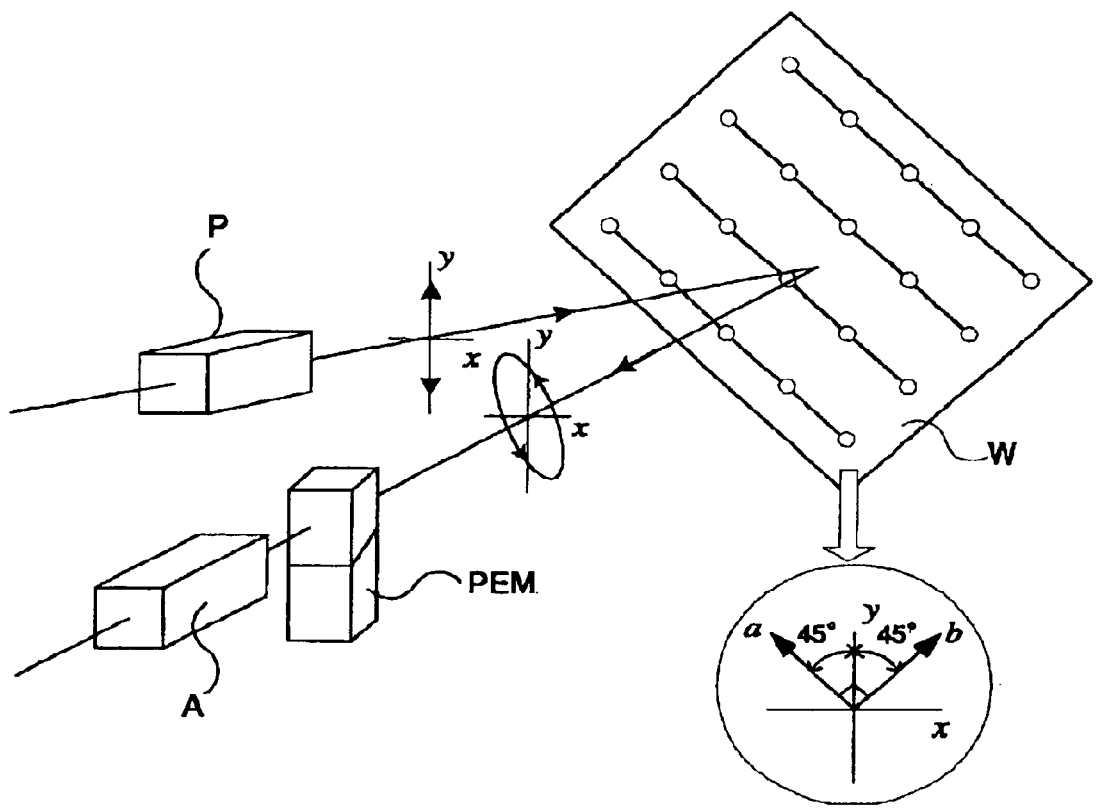
FIG. 3 is a view illustrating the basic structure for reflectance difference spectroscopy.

First, as an example, as illustrated in FIG. 3, the surface of specimen W having an optical anisotropy is irradiated with a linear polarized light that is polarized by an incident light polarizer P, where x-y coordinates are defined such that the polarization direction and y-axis are parallel to each other. At this time, the specimen W to be subjected to irradiation of light is placed in such a way that a main axis a of the anisotropy of the surface of specimen W and a main axis b perpendicular thereto are formed at an angle of 45° with respect to y-axis, respectively. Namely, the specimen W is placed in such a way to be irradiated with the incident light with equal intensity and phase in the component of direction a and that of direction b.

In the complex reflectance of light reflected from the specimen W, that is, $\bar{r} = re^{-i\theta}$, when only amplitude r has anisotropy, for example, $r_a$, amplitude of the reflectance in the direction of the main axis a, is larger than $r_b$, amplitude of the reflectance in the direction of the main axis b (that is, $r_a > r_b$), the reflected light should be linearly polarized, and the electric field direction will be shifted anticlockwise with respect to the y-axis. On the other hand, when only the phase thereof has anisotropy, for example, the phase of the electric field of light in the direction of a-axis delays with respect to the b-axis (that is, $\theta_a > \theta_b$), the reflected light will become an elliptical polarized light rotates from the direction of y-axis to the direction of a-axis. Generally, when both amplitude and phase thereof have anisotropy, the reflected light will become an elliptical polarized light whose long axis shifts from the direction of the incident polarization as illustrated in FIG. 3. Thus, the light reflected from the surface of specimen W having the optical anisotropy, a reflectance difference between the component parallel to the isotropic axis and the component perpendicular thereto is observed. Accordingly, the measurement of this reflectance difference makes it possible to obtain knowledge about the state of the surface having anisotropy.

Here, a complex reflectance difference, $\Delta \bar{r}/\bar{r}$, can be defined by expression (2) described below using the complex reflectance $\bar{r}_a$ in the direction of main axis a and the complex reflectance $\bar{r}_b$ in the direction of main axis b.

$$\frac{\Delta \bar{r}}{\bar{r}} = \frac{\bar{r}_a - \bar{r}_b}{(\bar{r}_a + \bar{r}_b)/2} \quad (2)$$

In general, the number of symmetries of the surface or the interface of the specimen is two or less, the complex reflectance difference, $\Delta \bar{r}/\bar{r}$, is observable. Namely, $\Delta \bar{r}/\bar{r}$, which is not zero, is allowed. For example, on the reconstructed surface of the diamond structure, etc., since (111) face has three symmetries, $\Delta \bar{r}/\bar{r} = 0$ is always established. On the other hand, since (110) surface and (001) surface have two symmetries, $\Delta \bar{r}/\bar{r} \neq 0$ is established. Accordingly, if the reconstruction of the surface or the interface occurs by the crystal growth and the like, thereby forming a surface or an interface having two or less symmetries, such as (110) surface, (−110) surface the characteristic (anisotropic) optical response deriving therefrom can be observed.

Moreover, the above expression (2) is appropriately expanded, thereby writing expression (3) as shown below. Accordingly, the anisotropy of the amplitude $\Delta \bar{r}/\bar{r}$ of an actual part and the anisotropy of the phase $\Delta\theta$ of an imaginary part are obtained, thereby obtaining the complex reflectance difference $\Delta \bar{r}/\bar{r}$ of the measuring surface.

$$\frac{\Delta \bar{r}}{\bar{r}} = \frac{\Delta r}{r} + i\Delta\theta \qquad (3)$$

As mentioned above, the complex reflectance difference $\Delta \bar{r}/\bar{r}$ can be obtained from the anisotropy of the amplitude $\Delta r/r$ and the anisotropy of the phase $\Delta\theta$, and the method using a photoelastic modulator (PEM) as illustrated in FIG. 3 is known. According to this method, the polarized light reflected from the anisotropic surface of the specimen W is modulated to a predetermined frequency by PEM, and a component of the modulated polarization at a predetermined angle is extracted by the polarizer A to detect a modulation component by an appropriate detection system. $\Delta r/r$ and $\Delta\theta$ can be obtained from the signal indicating the intensity of the modulated polarization component thus detected. Actually, however, the anisotropy of the phase $\Delta\theta$ is susceptible to the anisotropy of the window, other optical parts, etc., so that only $\Delta r/r$ is preferably measured.

The inventors of the present invention made endeavor wholeheartedly based on the knowledge of the surface analysis using the above-explained reflectance difference spectroscopy. As a result, we found it possible to observe the state in which the optical anisotropy of the interface between $SiO_2$/Si changes every oxidation of one atomic layer when a silicon oxide ($SiO_2$) film is formed in a layer-by-layer manner (every one atomic layer) by oxidation of the silicon (Si) surface or interface by use of the reflectance difference spectroscopy.

Figure 4:
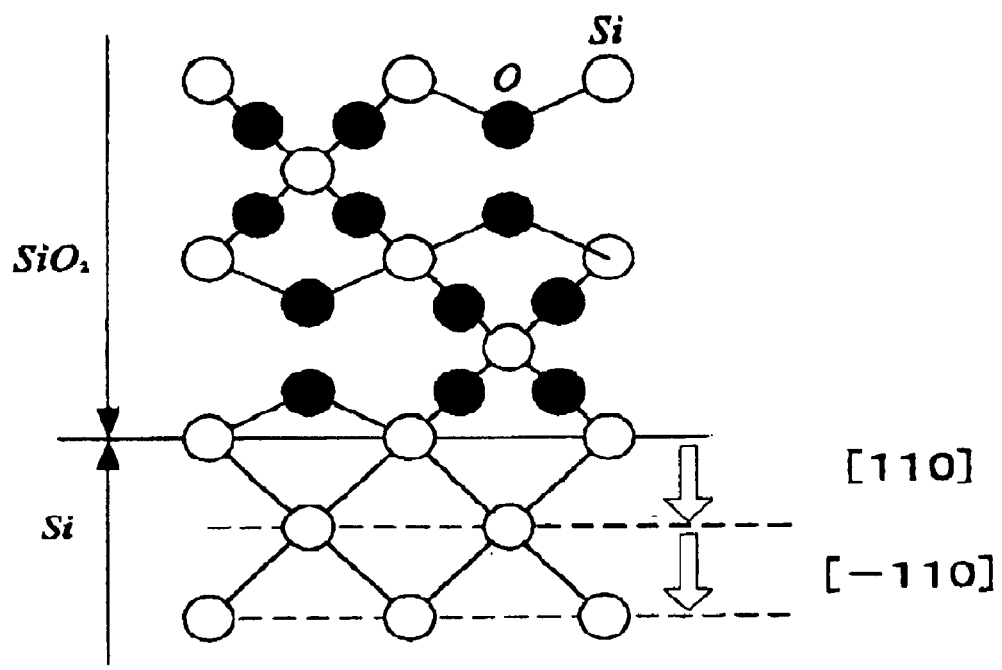
FIG. 4 is a view illustrating the state of a layer-by-layer oxidation of a silicon substrate.
Figure 5A:
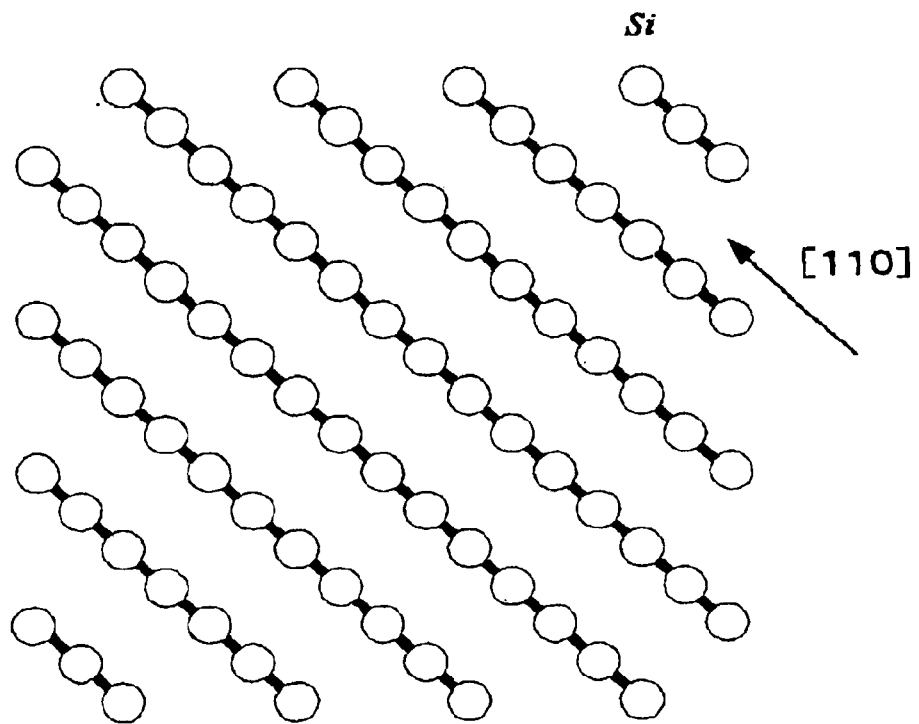
FIGS. 5A and 5B are views illustrating a silicon surface having an optical anisotropic main axis.
Figure 5B:
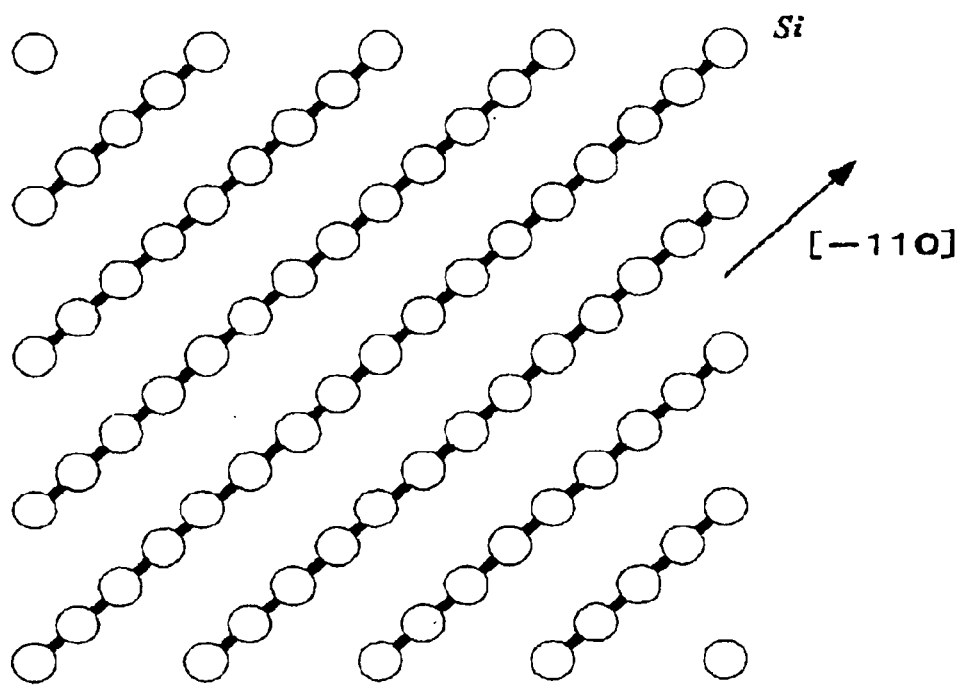

More specifically, the oxidation of Si (001) surface or interface advances every one atomic layer as an epitaxial growth illustrated in FIG. 4 (layer-by-layer oxidation). The direction of Si—Si bond, which is terminated at the interface between $SiO_2$/Si, which is the frontier, changes alternately at [110] orientation (FIG. 5A) and [−110] orientation (FIG. 5B) every oxidation of one atomic layer if the Si bonds are projected to (001) surface. These orientations serve as main axes of the anisotropy of the silicon surface or the interface. This means that the anisotropy of the-interfacial structure changes at 90° depending on the even or odd number of atomic layers. Accordingly, irradiating light upon the interface between $SiO_2$/Si and examining the reflectance difference between the components of [110] orientation and [−110] orientation with the light reflected from the interface, allow obtaining the knowledge about the state of interface. Moreover, since the reflectance of light changes linearly in accordance with the temperature and the wavelength of the light, it is possible to observe the state of the advance (growth) of the layer-by-layer oxidation of Si atomic layer in real time. Namely, the thickness of the film formed can be monitored in order of atomic layer.

Figure 6:
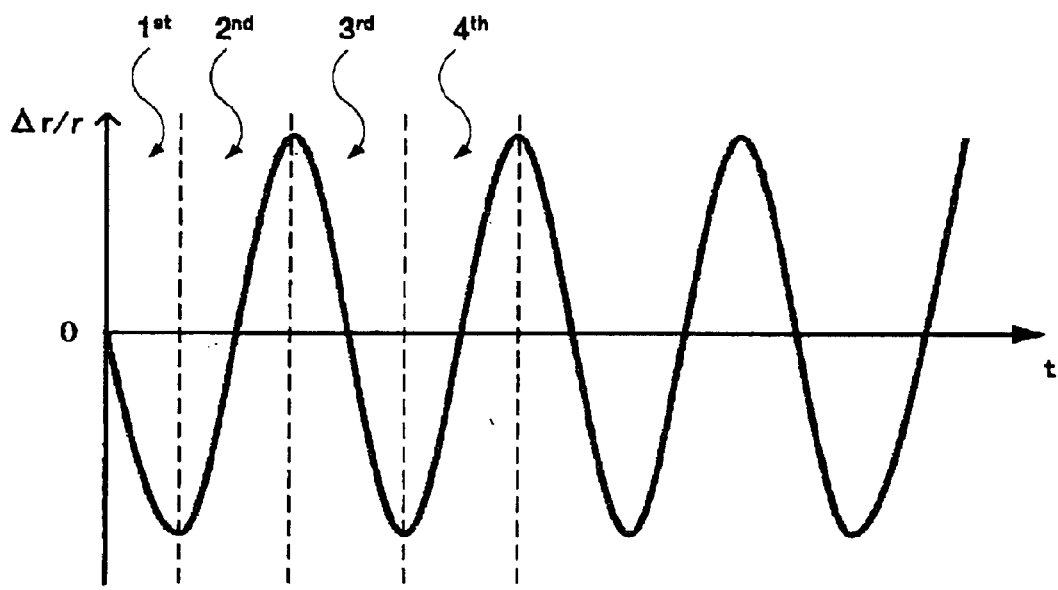
FIG. 6 is a graph illustrating a basic change in intensity between a reflectance difference when the layer-by-layer oxidation of silicon surface is monitored using light with a single wavelength.

FIG. 6 illustrates a change in basic signal over time, which is obtained by calculating the reflectance difference between the components in [110] orientation and [−110] orientation using the following expression (4) when irradiating a single wavelength light upon the processing surface during oxidation to form a $SiO_2$ film on the wafer W. As illustrated, one peak corresponds to the formation of one atomic layer. Accordingly, in the actual film forming process, if the measurement is started at the same time where the process starts, the thickness of the film formed can be monitored by counting the number of cycles of amplitude. For example, for growing a film having n layers during thermal oxidation, heating and gas supplying may be stopped at the time when n peaks are counted.

Note that, in the above measurement using the reflectance difference spectroscopy, $$\frac{\Delta \bar{r}}{\bar{r}} = \frac{\bar{r}_{[110]} - \bar{r}_{[-110]}}{(\bar{r}_{[110]} + \bar{r}_{[-110]})/2} \qquad (4)$$

the number of atomic layers to be measured, that is, the number n, is desirably 2 to 20. This is because the depth from the processing surface of the Si interface increases together with the growth of the oxide film, and the intensity of signals, which is reflected from the interface and observed, becomes weak with the increase in depth. Thus, since the degree of accuracy of film thickness data obtained from the measurement of the signal reduces with the increase in the depth of interface from the surface, the number of measuring atomic layers ranges from 2 to 20, preferably 2 to 10.

Next, an explanation will be given in the following of a series of processes for forming the gate insulating film using the manufacturing apparatus for the semiconductor device including the aforementioned optical measuring system 13.

First, the system controller 12 loads the wafer W into the load lock chamber 105 from the wafer cassette placed in the loader module 106. The loaded wafer W is carried into the cleaning chamber 101. In the cleaning chamber 101, the natural silicon oxide film on the wafer W is removed with diluted hydrofluoric acid. The wafer W cleaned is sent to the RTO chamber 102.

After placing the wafer W in the RTO chamber 102, the interior of RTO chamber 102 is evacuated to about 103 Torr, and $O_2$ (100 sccm) and Ar (1 slm) are introduced thereto to the pressure of about 30 Torr. After that, the lamp to heat is turned on to be heated at 150° C./sec, and the wafer W is heated for ten seconds after the temperature reaches 1050° C. During the heating process, the system controller 12 is monitoring the film thickness data received from the optical measuring system 13. Then, when receiving the data indicating that an oxide film with a desired thickness has been formed, the system controller 12 lowers the temperature at 70° C./sec. After the wafer W is completely cooled, the wafer W is unloaded from the RTO chamber 102 and is sent to the CVD chamber 103.

After the wafer W is transferred into the CVD chamber 103, the interior of the CVD chamber 103 is evacuated to a predetermined degree of vacuum state. Then, $Zr(OtBu)_4$ (2 sccm), TEOS (4 sccm), $H_2O$ (10 sccm) and $N_2$ (1 slm) are introduced into the CVD chamber 103 and the atmosphere in the CVD chamber 103 is maintained at the total pressure of 1 Torr. The CVD process is performed for three minutes as maintaining the temperature of wafer W at 450° C., and $ZrSiO_2$ is formed on the wafer W. After that, the wafer W is unloaded fm the CVD chamber 103 and is transferred into the annealing chamber 104.

The wafer W is heated at 400° C. to 900° C. for annealing in the annealing chamber 104. Thereafter, the wafer W is sent to the load lock chamber 105. The wafer W is carried to the loader module 106 and then unloaded from the manufacturing apparatus, so that the gate insulating film forming process ends.

According to the aforementioned process, the $SiO_2$ film was formed in a thickness of 8 angstrom (corresponding to four atomic layers) and $ZrSiO_2$ was formed in a thickness of 24 angstrom (efficient oxide film thickness was 13.3 angstrom). When a MOS capacitor was formed using the gate insulating film, the leak current thereof was $10^{-6}$ angstrom/cm$^2$, which was 6 or more orders of magnitude greater than that of the layer which was formed with the nearly same film thickness by the general method. Still moreover, interfacial level density was $5 \times 10^{10}$ cm$^{-2}$ (eV)$^{-1}$, and a long-time reliability test was excellent. As is obvious from the above result, it is possible to manufacture a silicon semiconductor device having an extremely thin film on its surface, particularly a field effect transistor such as MOS transistor having an extremely thin gate insulating film formed by use of the semiconductor device manufacturing apparatus of this embodiment. Accordingly, a high-quality semiconductor device can be manufactured.

The present invention is not limited to the above embodiment, and various modifications and applications may be possible. The following will explain a modification form of the above embodiment to which the present invention is applicable.

In the embodiment described above, the measuring light is irradiated to one point on the wafer W placed in the RTO chamber 102 for evaluating the surface state of the wafer W. However, the measuring light may be irradiated to a plurality of points on the wafer W to detect whether or not the film is uniformly formed on the entire surface of the wafer W. For example, the window 214 of RTO chamber 102 may be widened to arrange the plurality of optical measuring units 201.

In the embodiment described above, the wafer W was fixed and subjected to the oxidation in the RTO chamber 102, and the optical measurement was performed to the fixed wafer W. However, this structure of the embodiment is applicable in the case in which the wafer W is subjected to the oxidation as being rotated, so that the measurement can be carried during inline processing similar to the case in which the wafer W is fixed In the case where measurement is performed to the rotating wafer W as above, the measurement may be carried out in synchronization with a rotational frequency of wafer W while modulating measuring light by an oscillator and the like. In this case, a current is generated at frequency ω synchronized with the rotational frequency of wafer W and the curt is sent to the optical driver 202 to modulate the laser light at the frequency ω by the optical driver 202. When the modulated laser light is irradiated to the center of the rotation of the wafer W, two polarization components of reflected light are detected by the first and second sensors 212 and 213 and the detected signals are sent to the first and second lock-in amplifiers 203 and 204. In the first and second lock-in amplifiers 203 and 204, 2ω (twice of ω) is set as a reference frequency. Among the received signals, only signals $S_1$ and $S_2$, which are synchronized with the frequency of 2ω, are output to the analytical process unit 205. The analytical process unit 205 calculates the reflectance difference from the signals $S_1$ and $S_2$ synchronized with the frequency of 2ω. As explained above, by the same structure as the aforementioned embodiment, the in situ measurement for the rotating wafer W, and the measurement of the film thickness and the monitoring during the inline processing are possible.

In the aforementioned embodiment, the laser light, which is the measuring light, is depolarized by the depolarizer 210, and irradiated upon the surface of wafer W to detect the depolarization components in the direction anisotropic axes, which are present on the surface of wafer W. However, the measuring light is only to be uniform in its intensity and phase in the directions of two anisotropic axes perpendicular to each other in [110] orientation and [−110] orientation, which can be present on the surface Si (001) surface. For this reason, the linearly polarized light, which is polarized at 45° with respect to two directions to each other, may be used. In this case, the depolarizer 210 may be changed to a 45°-polaxizer as illustrated in FIG. 2.

In the above embodiment, the light with a single wavelength was used as measuring light. However, as mentioned above, light with a wide wavelength of e.g., a Xe lamp may be used as measuring light. In this case, the optical system as described in "Solid State Physics" Vol. 34, No. 2, pp. 19–29, 1999 may be employed.

Figure 7A:
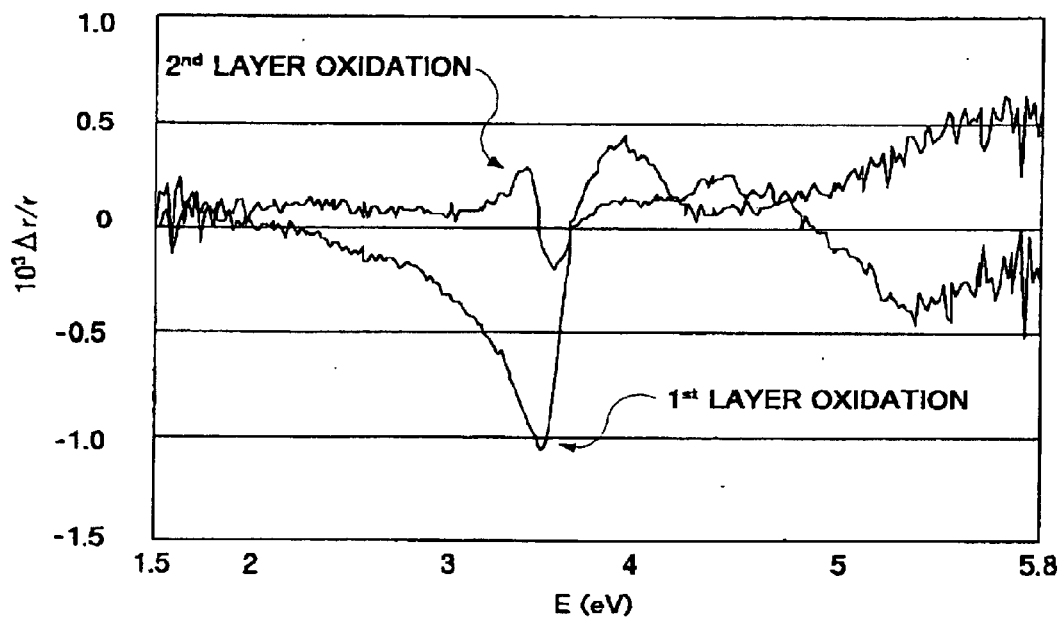
FIGS. 7A and 7B are graphs illustrating the spectrum of reflectance difference ($\Delta r/r$ and $\Delta\theta$, respectively) when the silicon surface on which one and two layers are oxidized is scanned by a Xe lamp.
Figure 7B:
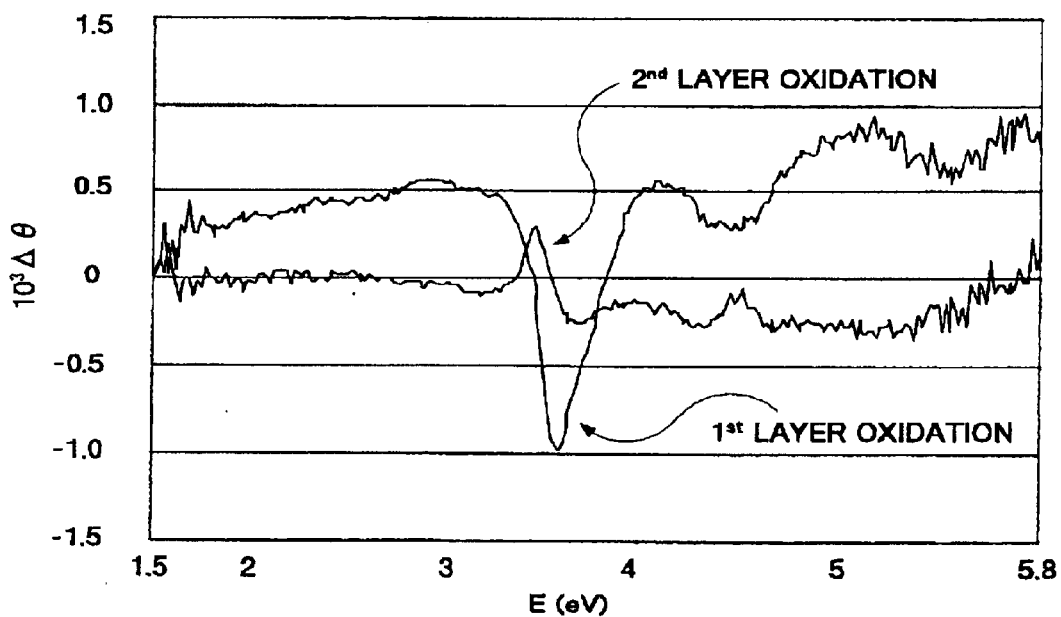

FIGS. 7A and 7B are reflectance difference spectrum linear diagrams relating to Δr/r and Δθ at the time of oxidizing first and second atomic layer from the surface of the Si substrate measured using the Xe lamp, which is the light with a wide wavelength. As is obvious from the diagrams, in the spectrum of first atomic layer oxidation and that of second atomic layer oxidation, each direction of the peak is reversed and its intensity lowered particularly around 3.3 eV (370 nm of wavelength). Thus, it is possible to know how much degree of thickness the film is formed, namely, how many atomic layers are formed, by examining the spectrum of reflectance difference Δr/r, for example, around 2 to 4 eV in advance.

In such a case, for example, the oxidation in the RTO chamber 102 is set to be carried out for a predetermined time, and the system controller 12 evaluates the processing surface of wafer W every time when one wafer W is processed. Or, in order to confirm whether or not the natural oxide film is sufficiently removed, the surface of wafer W is evaluated before oxidation. Accordingly, it is possible to evaluate the oxide film formed by oxidation and to manage the oxidation process based on the evaluation regardless of real time.

In the above embodiment, the measuring light has a wavelength of 39. 5 nm, namely, light around 3.14 eV. This is because this value is one close to $E_1$ transition (3.3 eV) of atoms of silicon and the most outstanding change in spectrum pattern can be observed when the monitoring is performed using light with the wavelength close to such a value. However, if it is possible to observe the change in the state of the silicon surface or the interface, light having any wavelength may be used, e.g., the wavelength of the measuring light may be changed depending on the temperature during oxidation.

In the semiconductor manufacturing apparatus of the above-mentioned embodiment, the optical measuring system 13 was applied to the RTO chamber 102 to provide the oxidation to the wafer W and to form the oxide film on the silicon semiconductor wafer W as monitoring the film thickness. However, the optical measuring system 13 may be applied to the process of forming not only the oxide film but also a nitride film or oxy-nitride film, where the process atmosphere includes gaseous nitrogen or nitrogen compound and/or oxygen or oxygen compounds For example, using the same structure as that of the above embodiment except that the RTO chamber 102 is replaced with the chamber for nitriding, a $Si_3N_4$ film with a thickness of, e.g., 15 angstrom can be formed with good controllability under conditions of $NH_3$, 760 Torr, 850° C., and one minute.

The above embodiment provided the structure in which the optical measuring unit 201 for performing the reflectance difference spectroscopy was attached to the RTO chamber 102 of the clustered manufacturing apparatus. However, the present invention is not limited to the above embodiment.

For example, the optical measuring unit 201 may be attached to the cleaning chamber for removing the natural oxide film with dilute hydrofluoric acid to scan the surface of wafer W using the light with a wide wavelength so as to check whether or not the natural oxide film on the wafer W is completely removed after cleaning. In this way, the checking is performed before forming the oxide film at the RTO chamber 102 to make it possible to prevent trouble such as a defective gate oxide film from being generated without fail.

Moreover, if the natural oxide film is found to be left on the cleaned wafer W, the cleaning may be performed for a sufficient time for removing the residual oxide film according to the thickness of the film. Namely, this can prevent the wafer from becoming defective if a next process is directly carried out, so that the wafer can be effectively used.

The optical measuring unit 201 may be attached to the CVD chamber 103. In this case, the wafer W, which has not been subjected to CVD yet, is measured by the optical measuring unit 201, to confirm the surface state of wafer W. Moreover, when a film is formed on the oxide film to a certain degree by the CVD, the anisotropic signal (reflectance difference) cannot be measured since the measuring light cannot reach the interface between $Si/SiO_2$ when using the light with a single wavelength. For this reason, the time where the anisotropic signal is disappear (not observed) may be used as an index, which may be employed to control the film thickness at the CVD process.

In the above embodiment, the manufacturing apparatus includes the cleaning chamber 101, RTO chamber 102, CVD chamber 103, and annealing chamber 104. However, a chamber having a different structure may also be included. For example, as an RTO chamber, there may be provided a chamber for oxidation such as ozone oxidation, plasma down-flow oxidation, and the like, or, additionally, a chamber for forming an oxide film, a nitride film and a polysilicon film by sputtering or CVD. Particularly, if it is possible to form the polysilicon film in the same manufacturing apparatus after forming the gate oxide film, there is such an advantage that the polysilicon constituting the gate electrode is formed on a gate insulating film without the natural oxide film on the gate insulating film.

In the above embodiment, the semiconductor device manufacturing apparatus of the present invention is structured to be a clustered manufacturing apparatus, i.e., a structure including a plural of process chambers. However, the semiconductor device manufacturing apparatus of the present invention is not limited to the clustered manufacturing apparatus. It is possible to measure the thickness of the film formed by use of the spectrum based on the reflectance difference spectroscopy even in a single apparatus that performs film forming process such as CVD sputtering, thermal oxidation, nitriding, or oxy-nitriding, or process for removing the film such as etching. Moreover, even in a batch process executed by a single processing apparatus, the aforementioned optical measurement can be provided to the exam wafer W to perform the management in the corresponding process. Note that the wafer W is not carried out of the apparatus until a series of processes ends when the clustered manufacturing apparatus is used. For this reason, as explained in the present embodiment, there is such an advantage that the presence or absence of trouble in each process during a series of processes can be checked by performing optical evaluation in the clustered manufacturing apparatus. Moreover, the state of the surface of a wafer W is not influenced by the environmental conditions (presence of oxygen, moisture, etc.) of the outside of the apparatus. Therefore, it is possible to grasp the actual thickness of the formed oxide film with less than 10 angstrom as eliminating the influence of, e.g., natural oxide film.

In the above embodiment, another structure may be used as the structure of optical measuring unit 201 using the reflectance difference spectroscopy. Namely, any structure may be possible if the structure can measure the part that changes depending on the polarization direction in connection with the reflectance of light vertically irradiated upon the surface of the wafer W. This measurement includes, for example, a method for directly detecting polarization light reflected after irradiating the fixed wafer W with two polarization light respectively parallel to two anisotropic axes of the surface of wafer W.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2000-310968 filed on Oct. 11, 2000 and including specification, claims, drawings and summary. The disclosure of the above Japanese Patent Application is incorporated herein by reference in its entirety.

What is claimed is:

1. A manufacturing method for a field-effect transistor comprising steps of:

heating a semiconductor substrate which is rotated with a predetermined rotational frequency in a predetermined gas atmosphere to advance a reaction between said gas atmosphere and said semiconductor substrate inwardly from a surface of said semiconductor substrate such that an insulating film formed by said reaction grows from the surface of said semiconductor substrate toward an inside of said semiconductor substrate:

irradiating light which is modulated with said predetermined rotational frequency upon the surface of said semiconductor substrate during said heating step and detecting intensity synchronizing with a frequency twice as large as said predetermined rotational frequency of polarization components in two directions perpendicular to each other of light reflected from an interface between said semiconductor substrate and said grown insulating film, to obtain a thickness of said insulating film in a unit of atomic layer based on a change in the detected intensity;

detecting an end point of said reaction based on the film thickness obtained in said irradiating step to terminate said heating step;

forming a dielectric film, having a dielectric constant higher than said insulating film, on said insulating film; and forming a gate electrode on said dielectric film.

2. The manufacturing method for a field-effect transistor according to claim 1, wherein said semiconductor substrate includes a silicon substrate, said predetermined gas atmosphere includes atmosphere including oxygen or oxygen compound and/or nitrogen or nitrogen compound, said heating step includes a step of forming an oxide film or a nitride film, or an oxy-nitride film, and said irradiating step includes a step of detecting only a predetermined number of atomic layers of insulating layer having 2 to 20 atomic layers.

3. A manufacturing method for a semiconductor device comprising steps of:
- advancing a reaction toward an inside of a target which is rotated with a predetermined rotational frequency to form a film in a surface area of said target;
- irradiating light which is modulated with said predetermined rotational frequency upon the surface area of said target;
- detecting intensity synchronizing with a frequency twice as large as said predetermined rotational frequency of polarization components in two directions perpendicular to each other of the irradiated light which is reflected from the surface of said target;
- obtaining a thickness of said film formed in said reaction based on a change in the intensity of polarization components of said reflected light detected; and
- controlling said reaction based on a film thickness obtained.

4. The manufacturing method for a semiconductor device according to claim 3, wherein said advancing step includes a step of heating said target in a predetermined atmosphere to advance a reaction between a material in said atmosphere and said target to form a thin film in the surface area of said target, said obtaining step includes a step of calculating a value corresponding to a value obtained by dividing a difference in reflectances of polarization components in two directions perpendicular to each other by an arithmetic average of reflectances of polarization components in said two directions, based on intensity of said polarization components in the two ways of said light irradiated upon said target, and said controlling step includes a step of obtaining the thickness of said film based on a change in the value obtained in said calculating step.

5. The manufacturing method for a semiconductor device according to claim 4, wherein said controlling step includes a step of obtaining a degree of advancement of the reaction in a unit of atomic layer in the depth direction of said film based on the change in the value obtained in said calculating step.

6. The manufacturing method for a semiconductor device according to claim 4, wherein said target includes a silicon substrate, said predetermined atmosphere includes oxygen or oxygen compound and/or nitrogen or nitrogen compound, said advancing step includes a step of forming an oxide film or a nitride film, or an oxy-nitride film, and said obtaining step includes a step of detecting only a predetermined number of atomic layers of insulating layer having 2 to 20 atomic layers.

7. The manufacturing method for a semiconductor device according to claim 3, wherein said controlling step includes a step of terminating said reaction based on the obtained film thickness.

8. The manufacturing method for a semiconductor device according to claim 3, wherein said advancing step includes a step of heating said target in said predetermined gas atmosphere to form said film.

9. A manufacturing apparatus for a semiconductor device comprising:
- a process chamber for thermally processing a target which is rotated with a predetermined rotational frequency in atmosphere including a predetermined gas;
- an optical apparatus for irradiating light which is modulated with said predetermined rotational frequency upon said target provided in said process chamber, measuring intensity of polarization components in two directions perpendicular to each other of light reflected from said target, and outputting a measurement signal which synchronizes with a frequency twice as large as said predetermined rotational frequency; and
- a controller, which is connected to said process chamber and said optical apparatus, for starting a thermal processing to form a film in said target in said process chamber in atmosphere including said predetermined gas, obtaining a thickness of said film formed during said thermal processing based on the measurement signal from said optical apparatus, and terminating said thermal processing if the thickness of said film reaches a predetermined value.

10. The manufacturing apparatus for a semiconductor device according to claim 9, further comprising:
- a common room for connecting said process chamber with other chambers in an airtight manner; and
- a transfer mechanism located in said common room for transferring said target between said process chamber and one of said other chambers or between said other chambers.

* * * * *